United States Patent
Liu et al.

(10) Patent No.: US 9,841,509 B2
(45) Date of Patent: Dec. 12, 2017

(54) PROCESSES FOR FABRICATING ORGANIC X-RAY DETECTORS, RELATED X-RAY DETECTORS AND SYSTEMS

(71) Applicant: General Electric Company, Schenectady, NY (US)

(72) Inventors: Jie Jerry Liu, Niskayuna, NY (US); Kwang Hyup An, Rexford, NY (US); Gautam Parthasarathy, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 14/949,972

(22) Filed: Nov. 24, 2015

(65) Prior Publication Data
US 2017/0146670 A1    May 25, 2017

(51) Int. Cl.
*G01T 1/20*    (2006.01)
*H01L 51/00*   (2006.01)
*H01L 51/44*   (2006.01)
*H01L 27/30*   (2006.01)

(52) U.S. Cl.
CPC .......... *G01T 1/2018* (2013.01); *H01L 27/308* (2013.01); *H01L 51/0002* (2013.01); *H01L 51/0026* (2013.01); *H01L 51/441* (2013.01)

(58) Field of Classification Search
CPC .. G01T 1/2018; H01L 51/0002; H01L 51/441
See application file for complete search history.

(56) References Cited

U.S. PATENT DOCUMENTS

| | | | |
|---|---|---|---|
| 8,637,831 B2 | 1/2014 | Hayden et al. | |
| 8,809,796 B2 | 8/2014 | Jung | |
| 8,822,930 B2 | 9/2014 | Soukal et al. | |
| 2008/0023638 A1 | 1/2008 | Starman et al. | |
| 2008/0083877 A1* | 4/2008 | Nomura | G01T 1/2018 250/370.11 |
| 2008/0237481 A1* | 10/2008 | Zentai | H01L 27/14618 250/370.12 |

(Continued)

FOREIGN PATENT DOCUMENTS

WO    2007017475 A1    2/2007

OTHER PUBLICATIONS

Kim et al., "Device Annealing Effect in Organic Solar Cells with Blends of Regioregular Poly (3-hexylthiophene) and Soluble Fullerene", Applied Physics Letters, vol. No. 86, Issue No. 6, pp. 063502-1 to 063502-4, Jan. 31, 2005.

(Continued)

*Primary Examiner* — Mark R Gaworecki
(74) *Attorney, Agent, or Firm* — Pabitra K. Chakrabarti

(57) ABSTRACT

A process for fabricating an organic x-ray detector is presented. The process includes forming a multilayered structure that includes disposing a first electrode layer on a thin film transistor array, disposing an organic absorber layer on the first electrode layer, and disposing a second electrode layer on the organic absorber layer. The process further includes disposing a scintillator layer on the second electrode layer and thermally treating the multilayered structure after the step of disposing the second electrode layer. An organic x-ray detector fabricated by the process is further presented. An x-ray system including the organic x-ray detector is also presented.

16 Claims, 10 Drawing Sheets

(56) References Cited

U.S. PATENT DOCUMENTS

| | | | |
|---|---|---|---|
| 2011/0250718 A1* | 10/2011 | Loo | B82Y 10/00 438/82 |
| 2014/0225094 A1 | 8/2014 | Fraboni et al. | |
| 2015/0034910 A1* | 2/2015 | Parthasarathy | H01L 27/308 257/40 |
| 2015/0144889 A1 | 5/2015 | An et al. | |
| 2015/0204987 A1* | 7/2015 | Okada | G01T 1/2018 250/369 |

OTHER PUBLICATIONS

Bertho et al., "Effect of Temperature on the Morphological and Photovoltaic Sability of Bulk Heterojunction Polymer: Fullerene Solar Cells", Solar Energy Materials and Solar Cells, vol. No. 92, Issue No. 7, pp. 753-760, Mar. 4, 2008.

Buchele et al., "X-ray Imaging with Scintillator-Sensitized Hybrid Organic Photodetectors", Nature Photonics, vol. No. 09, Issue No. 12, pp. 843-848, Nov. 9, 2015.

PCT Invitation to Pay Additional Fees issued in connection with corresponding PCT Application No. PCT/US2016/053663 dated Jan. 12, 2017.

Chen et al., "Recent Progress in Polymer Solar Cells: Manipulation of Polymer:Fullerene Morphology and the Formation of Efficient Inverted Polymer Solar Cells", Advanced Materials, vol. 21, 2009,pp. 1434-1449.

Kumar et al., "Origin of Radiation-Induced Degradation in Polymer Solar Cells", Adv. Fund. Mater,2010,vol. 20, pp. 2729-2736.

Kokubu et al., "Vertical phase separation of conjugated polymer and fullerene bulk heterojunction films induced by high pressure carbon dioxide treatment at ambient temperature",Phys. Chem. Chem. Phys., vol. 14, 2012, pp. 8313-8318.

Paez-Sierra et al., "Fabrication of an x-ray detector based on molecular plastic electronics", Proc. SPIE 9185, Organic Field-Effect Transistors XIII; and Organic Semiconductors in Sensors and Bioelectronics VII, 91851P. vol. 9185, Oct. 7, 2014, 7 Pages.

Zhang, et al., "Vertical phase separation in bulk heterojunction solar cells formed by in situ polymerization of fulleride", Scientific Reports 4, 2014, 8 Pages.

* cited by examiner

PROCESSES FOR FABRICATING ORGANIC X-RAY DETECTORS, RELATED X-RAY DETECTORS AND SYSTEMS

BACKGROUND

Embodiments of the present disclosure generally relate to organic x-ray detectors. More particularly, embodiments of the present disclosure relate to processes for fabricating organic x-ray detectors.

Digital x-ray detectors fabricated with continuous photodiodes have potential applications for low cost digital radiography as well as for rugged, light-weight and portable detectors. Digital x-ray detectors with continuous photodiodes have an increased fill factor and potentially higher quantum efficiency. The continuous photodiodes generally include organic photodiodes (OPDs). A scintillator which converts x-ray to visible light is generally disposed on top of the OPDs.

One of the technical challenges for organic x-ray detectors (OXRDs) may be a high lag. A lag is defined as a delayed temporal response parameter that measures an amount of residual signals under given testing conditions. Since the residual signals fade with a finite time constant, a high lag may indicate a high amount of residual signal, which may be equivalent to a long time lapse required to overcome any possible lag-related artifacts. A low lag (for example, <5 percent) may be desirable for advanced applications such as fluoroscopy that require either rapid readout or multi-frame viewing.

Therefore, there is a need for x-ray detectors with low lag values and processes for fabricating the x-ray detectors.

BRIEF DESCRIPTION

Embodiments of the present disclosure meet these and other needs by providing a process for fabricating an organic x-ray detector. Accordingly, one aspect of the specification presents a process for fabricating an organic x-ray detector. The process includes forming a multilayered structure that includes disposing a first electrode layer on a thin film transistor array, disposing an organic absorber layer on the first electrode layer, and disposing a second electrode layer on the organic absorber layer. The process further includes disposing a scintillator layer on the second electrode layer and thermally treating the multilayered structure after the step of disposing the second electrode layer.

In one aspect of the specification, an organic x-ray detector fabricated by the process is provided. One aspect presents an x-ray system including the organic x-ray detector.

In one aspect of the specification, an organic x-ray detector has a lag value equal to or less than about 4 percent.

In one aspect of the specification, a process for fabricating an organic x-ray detector includes forming a multilayered structure that includes disposing a first electrode layer on a thin film transistor array, disposing an organic absorber layer on the first electrode layer, and disposing a second electrode layer on the organic absorber layer; and thermally treating the multilayered structure after the step of disposing the second electrode layer. The process further includes disposing a scintillator layer on the thermally treated multilayered structure.

DRAWINGS

These and other features, aspects, and advantages of the present disclosure will become better understood when the following detailed description is read with reference to the accompanying drawings, wherein.

DETAILED DESCRIPTION

Figure 1:
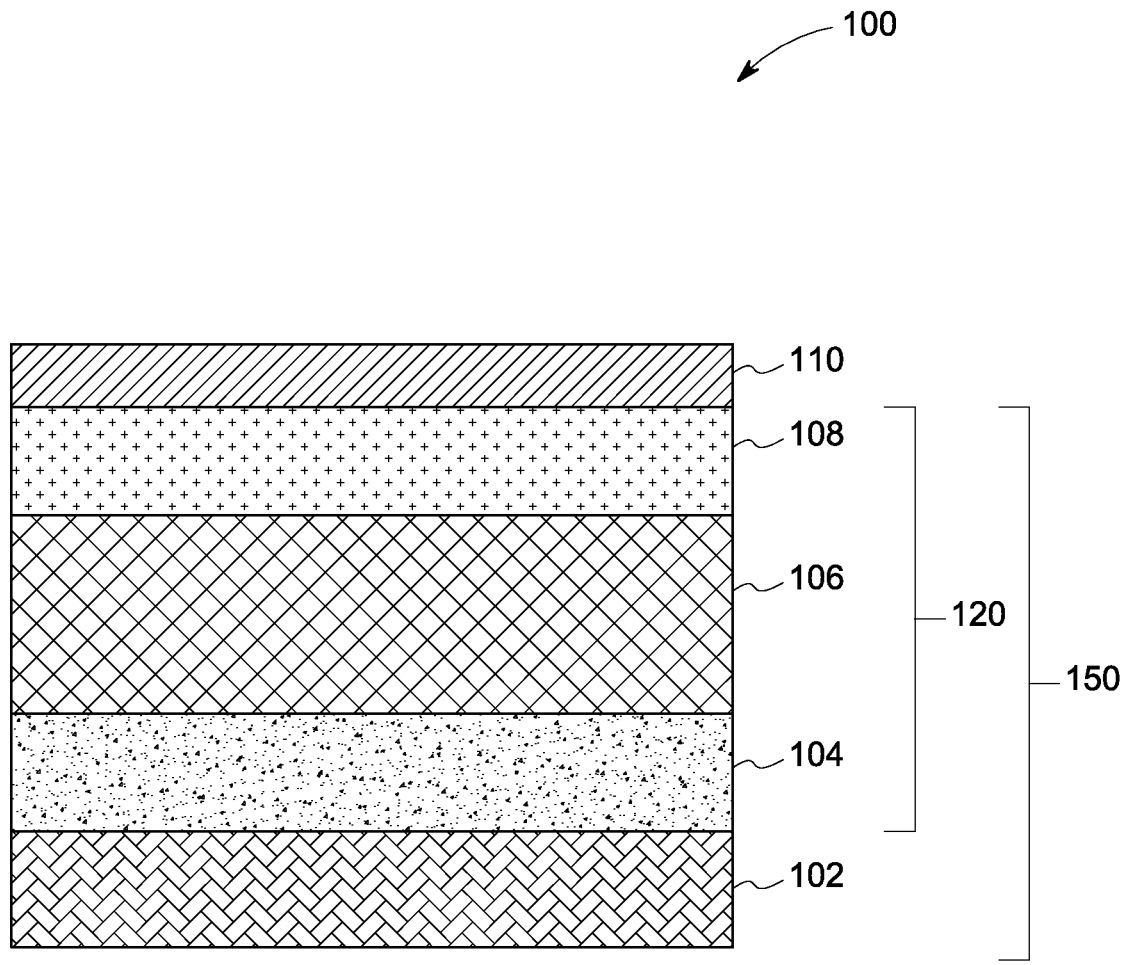
FIG. 1 is a schematic of an organic x-ray detector, in accordance with one embodiment of the invention.

As discussed in detail below, some of the embodiments of the present disclosure relate to processes for fabricating an organic x-ray detector. More particularly, some embodiments relate to processes for fabricating an organic x-ray detector using a thermal treatment step.

In the following specification and the claims, the singular forms "a", "an" and "the" include plural referents unless the context clearly dictates otherwise. As used herein, the term "or" is not meant to be exclusive and refers to at least one of the referenced components being present and includes instances in which a combination of the referenced components may be present, unless the context clearly dictates otherwise.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

Unless defined otherwise, technical and scientific terms used herein have the same meaning as is commonly understood by one of skill in the art to which this invention belongs. The terms "comprising," "including," and "having" are intended to be inclusive, and mean that there may be additional elements other than the listed elements. The terms "first", "second", and the like, as used herein do not denote any order, quantity, or importance, but rather are used to distinguish one element from another.

As used herein, the term "layer" refers to a material disposed on at least a portion of an underlying surface in a continuous or discontinuous manner. Further, the term "layer" does not necessarily mean a uniform thickness of the disposed material, and the disposed material may have a uniform or a variable thickness. As used herein, the term "disposed on" refers to layers disposed directly in contact with each other or indirectly by having intervening layers there between, unless otherwise specifically indicated.

In the present disclosure, when a layer is being described as "on" another layer or substrate, it is to be understood that the layers can either be directly contacting each other or have one (or more) layer or feature between the layers. Further, the term "on" describes the relative position of the layers to each other and does not necessarily mean "on top of" since the relative position above or below depends upon the orientation of the device to the viewer. Moreover, the use of "top," "bottom," "above," "below," and variations of these terms is made for convenience, and does not require any particular orientation of the components unless otherwise stated.

Some embodiments of the present disclosure are directed to a process for fabricating an organic x-ray detector. The process includes forming a multilayered structure that includes disposing a first electrode layer on a thin film transistor array, disposing an organic absorber layer on the first electrode layer; and disposing a second electrode layer on the organic absorber layer. The process further includes thermally treating the multilayered structure after the step of disposing the second electrode layer.

In some embodiments, the process for fabricating an organic x-ray detector 100 is described with reference to FIGS. 1-3. The organic x-ray detector 100 includes a multilayered structure 150 and a scintillator layer 110 disposed on the multilayered structure 150.

Figure 2:
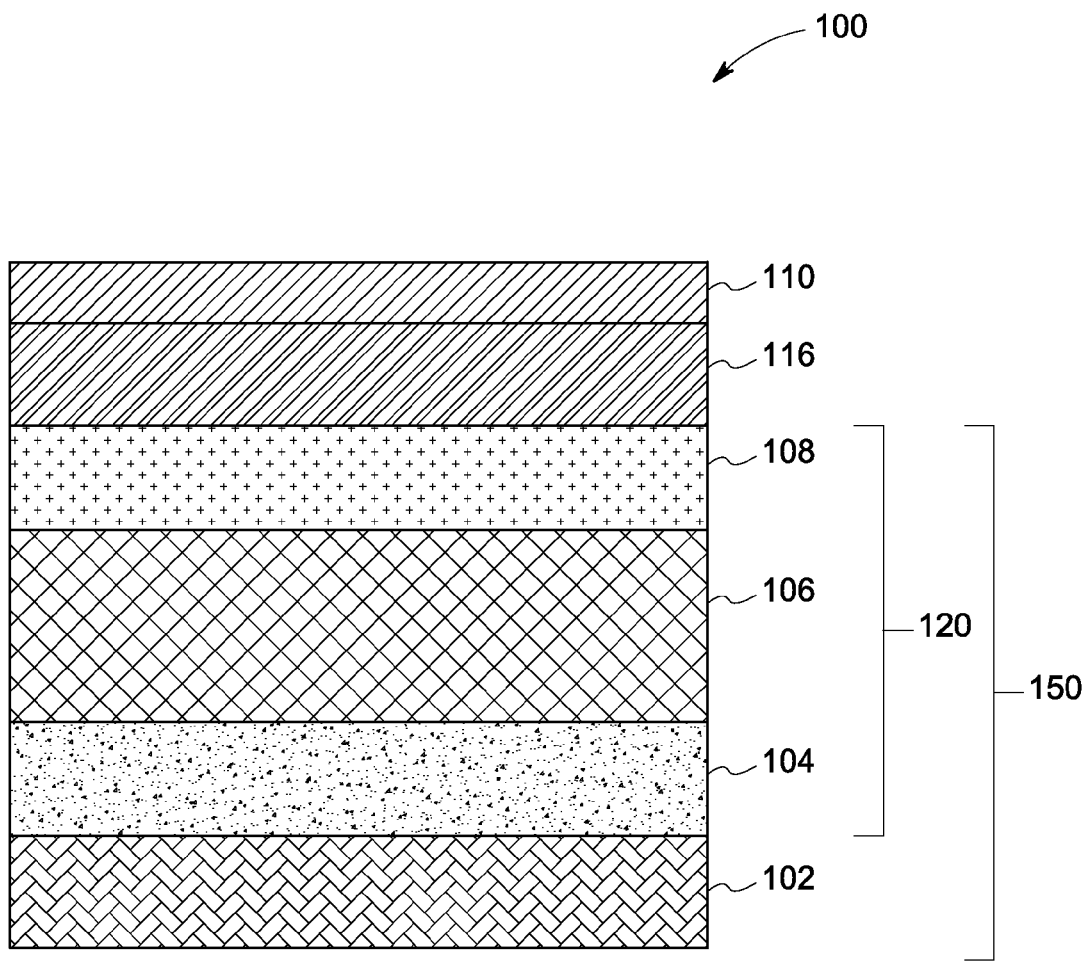
FIG. 2 is a schematic of an organic x-ray detector, in accordance with one embodiment of the invention.
Figure 3:
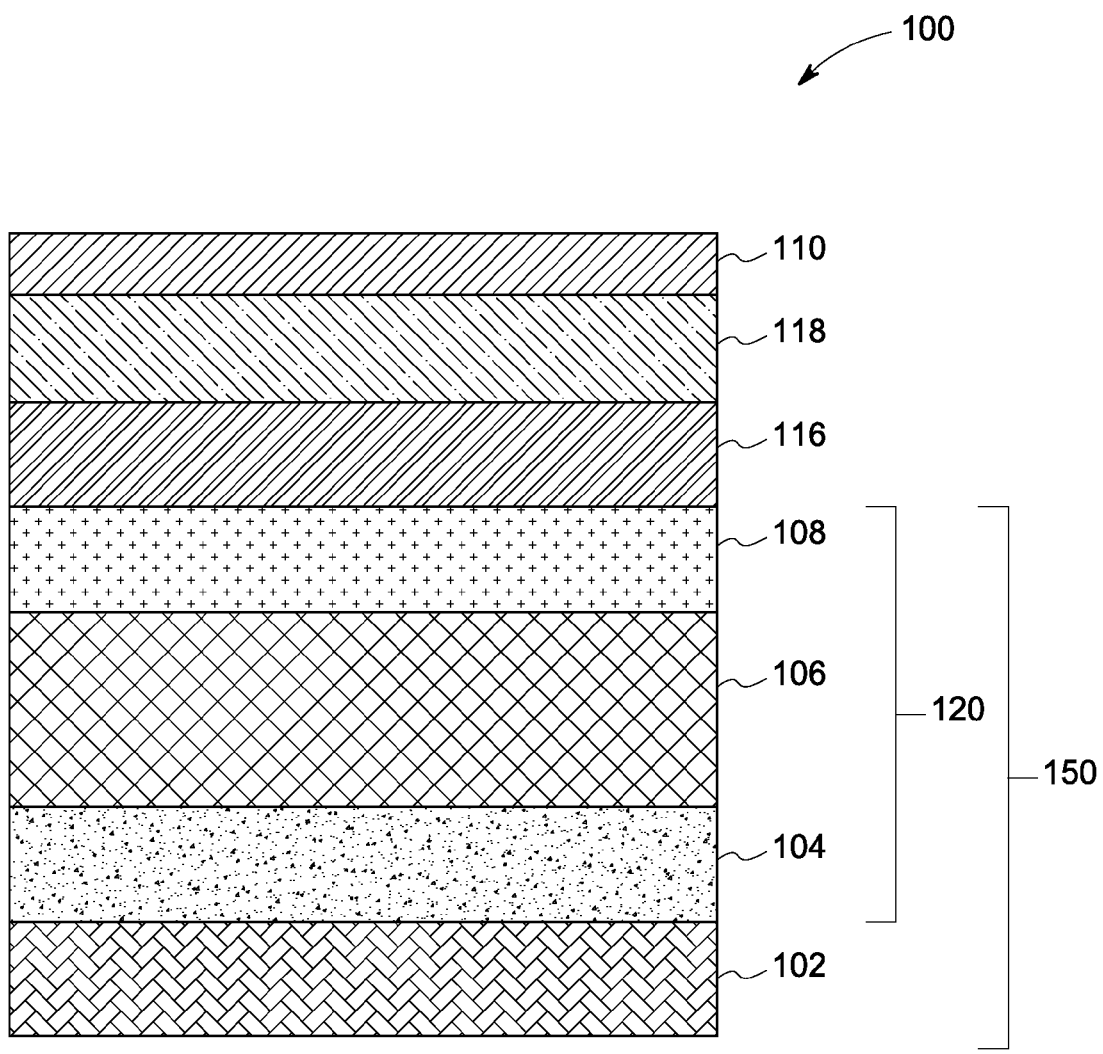
FIG. 3 is a schematic of an organic x-ray detector, in accordance with one embodiment of the invention.

In some embodiments, as depicted in FIGS. 1-3, the multilayered structure 150 includes a first electrode layer 104 disposed on a thin-film transistor (TFT) array 102, an organic absorber layer 106 disposed on the first electrode layer 104, and a second electrode layer 108 disposed on the absorber layer 106. The organic absorber layer 106 may also referred to as an "active layer." In some embodiments, the organic absorber layer 106 may be patterned. The first electrode layer 104, the organic absorber layer 106, and the second electrode layer 108 may form an organic photodiode 120 disposed on the TFT array 102.

Depending on the application and variations in design, the organic photodiode 120 may include a single organic layer or may include multiple organic layers. In some embodiments, the organic photodiode 120 may further include one or more charge blocking layers, for example, an electron blocking layer and a hole blocking layer (not shown in Figures). In some embodiments, an electron blocking layer may be disposed between the first electrode layer 104 and the absorber layer 106. In some embodiments, a hole blocking layer may be disposed between the absorber layer 106 and the second electrode layer 108. Further, the organic photodiode 120 may be directly disposed on the TFT array 102 or the design may include one or more layers disposed between the organic photodiode 120 and the TFT array 102.

The organic absorber layer 106 may be a bulk, heterojunction organic photodiode layer that absorbs light, generates electron-hole pairs (excitons), and transports charge (holes and electrons) to the contact layers (electrode layers). The organic absorber layer 106 may include a blend of a donor material and an acceptor material; more than one donor or acceptor may be included in the blend. Further, the HOMO/LUMO levels of the donor and acceptor materials may be compatible with that of the first and second electrodes (104, 108) in order to allow efficient charge extraction without creating an energetic barrier.

As used herein, the terms "donor material", "donor phase" and "donor" may be used interchangeably throughout the specification; and the terms "acceptor material", "acceptor phase" and "acceptor" may be used interchangeably throughout the specification.

The performance of an organic photodiode and an organic x-ray detector (for example, as depicted in FIGS. 1-3) may depend on the charge generation and charge transport within an organic absorber layer. An efficient charge generation and charge transport with the absorber layer may depend on the morphology of the absorber layer. Referring to FIGS. 1-3, in some embodiments, the absorber layer 106 may have substantially uniform morphology. As used herein, the term "uniform morphology" refers to a bulk and homogeneous phase separation, and continuous distribution of a donor material (or donor phase) and an acceptor material (or acceptor phase) throughout a thickness of the absorber layer. The term, "homogeneous phase separation", as used herein, means that the donor phase and the acceptor phase are in proximity that is, within a dimension of about 10 nanometers to ensure efficient exciton dissociation and charge generation. In some embodiments, the absorber layer has a homogeneous phase separation with a dimension in a range from about 8 nanometers to about 15 nanometers. Further, in some embodiments, the donor phase and the acceptor phase are distributed continuously and uniformly throughout the thickness of the absorber layer to ensure efficient charge transport and charge extraction from the first and second electrodes.

Suitable donor materials include low bandgap polymers having LUMO ranging from about 1.9 eV to about 4.9 eV and HOMO ranging from about 2.9 eV to about 7 eV. In some embodiments, the donor material has LUMO in a range from 2.5 eV to 4.5 eV, and in certain embodiments, from 3.0 eV to 4.5 eV. In some embodiments, the donor material has HOMO in a range from 4.0 eV to 6 eV, and in certain embodiments, from 4.5 eV to 6 eV. The low band gap polymers include conjugated polymers and copolymers composed of units derived from substituted or unsubstituted monoheterocyclic and polyheterocyclic monomers such as thiophene, fluorene, phenylenvinylene, carbazole, pyrrolopyrrole, and fused heteropolycyclic monomers containing the thiophene ring, including, but not limited to, thienothiophene, benzodithiophene, benzothiadiazole, pyrrolothiophene monomers, and substituted analogs thereof. In some embodiments, the low band gap polymers include units derived from substituted or unsubstituted thienothiophene, benzodithiophene, benzothiadiazole, carbazole, isothianaphthene, pyrrole, benzo-bis(thiadiazole), thienopyrazine, fluorene, thiadiazolequinoxaline, or combinations thereof. In the context of the low band gap polymers described herein, the term "units derived from" means that the units include monoheterocyclic and polyheterocyclic group, without regard to the substituents present before or during the polymerization; for example, "the low band gap polymers include units derived from thienothiophene" means that the low band gap polymers include divalent thienothiophenyl groups. Examples of suitable materials for use as low bandgap polymers in the organic x-ray detectors, in some embodiments, include copolymers derived from substituted or unsubstituted thienothiophene, benzodithiophene, benzothiadiazole, carbazole monomers, or combinations thereof, such as poly[[4,8-bis[(2-ethyl hexyl)oxy]benzo[1,2-b:4,5-b']dithiophene-2,6-diyl][3-fluoro-2-[(2-ethylhexyl)carbonyl] thieno[3,4-b]thiophenediyl (PTB7); 2,1,3-benzothiadiazole-4,7-diyl]4,4-bis(2-ethylhexyl)-4H-cyclopenta[2,1-b:3,4-b']dithiophene-2,6-diyl (PCPDTBT); poly[[9-(1- octylnonyl)-9H-carbazole-2,7-diyl]-2,5-thiophenediyl-2,1,
3-benzothiadiazole-4,7-diyl-2,5-thiophenediyl] (PCDTBT);
poly[(4,40-bis(2-ethylhexyl)dithieno [3,2-b:20,30-d]silole)-
2,6-diyl-alt-(2,1,3-benzo-thiadiazole)-4,7-diyl] (PSBTBT);
poly((4,8-bis(octyloxy)benzo(1,2-b:4,5-b')dithiophene-2,6-
diyl)(2-((dodecyloxy)carbonyl) thieno(3,4-b)thio-
phenediyl)) (PTB1); poly((4,8-bis(octyloxy)benzo(1,2-b:4,
5-b')dithiophene-2,6-diyl)(2-((ethylhexyloxy)carbonyl)
thieno(3,4-b)thiophenediyl)) (PTB2); poly((4,8-bis(octyl)
benzo(1,2-b:4,5-b')dithiophene-2,6-diyl) (2-((ethylhexy-
loxy)carbonyl) thieno(3,4-b)thiophenediyl)) (PTB3); poly
((4,8-bis-(ethylhexyloxybenzo(1,2-b:4,5-b')dithiophene-2,
6-diyl)(2-((octyloxy)carbonyl)-3-fluoro)thieno(3,4-b)
thiophenediyl)) (PTB4); poly((4,8-bis(ethylhexyloxybenzo
(1,2-b:4,5-b')dithiophene-2,6-diyl)(2-((octyloxy)carbonyl)
thieno(3,4-b)thiophenediyl)) (PTB5); poly((4,8-bis(octy-
loxy)benzo(1,2-b:4,5-b')dithiophene-2,6-diyl)(2-((butyloc-
tyloxy)carbonyl) thieno(3,4-b)thiophenediyl)) (PTB6); poly
[[5-(2-ethylhexyl)-5,6-dihydro-4,6-dioxo-4H-thieno[3,4-c]
pyrrole-1,3-diyl][4,8-bis[(2-ethylhexyl)oxy]benzo [1,2-b:4,
5-b']dithiophene-2,6-diyl]](PBDTTPD); poly[1-(6-{4,8-bis
[(2-ethylhexyl)oxy]-6-methylbenzo[1,2-b:4,5-b']
dithiophen-2-yl}-3-fluoro-4-methylthieno[3,4-b]thiophen-
2-yl)-1-octanone] (PBDTTT-CF); or poly[2,1,3-
benzothiadiazole-4,7-diyl-2,5-thiophenediyl (9,9-dioctyl-
9H-9-silafluorene-2,7-diyl)-2,5-thiophenediyl] (PSiF-DBT).
Other suitable materials include poly[5,7-bis (4-decanyl-2-
thienyl) thieno[3,4-b]diathiazole-thiophene-2,5] (PDDTT);
poly[2,3-bis(4-(2-ethylhexyloxy)phenyl)-5,7-di(thiophen-2-
yl)thieno[3,4-b]pyrazine] (PDTTP); or polythieno[3,4-b]
thiophene (PTT). In certain embodiments, suitable materials
are copolymers derived from substituted or unsubstituted
benzodithiophene monomers, such as the PTB1-7 series and
PCPDTBT; or benzothiadiazole monomers, such as
PCDTBT and PCPDTBT.

Suitable acceptor materials include fullerenes and their
derivatives such as [6,6]-phenyl-$C_{61}$-butyric acid methyl
ester (PCBM); PCBM analogs such as $PC_{70}BM$, $PC_{71}BM$,
$PC_{80}BM$, bis-adducts thereof, such as bis-$PC_{71}BM$, indene
mono-adducts thereof, such as indene-$C_{60}$ monoadduct
(ICMA) or indene bis-adducts thereof, such as indene-$C_{60}$
bisadduct (ICBA). Other examples of acceptor materials
include poly[(9,9-dioctylfluorenyl-2,7-diyl)-alt-(4,7-bis(3-
hexylthiophen-5-yl)-2,1,3-benzothiadiazole)-2',2''-diyl]
(F8TBT) may also be used, alone or with a fullerene
derivative.

In one embodiment, the first electrode layer 104 functions
as a cathode and the second electrode layer 108 as an anode.
In another embodiment, the first electrode layer 104 func-
tions as an anode and the second electrode layer 108 as a
cathode. Suitable anode materials include, but are not lim-
ited to, metals such as Al, Ag, Au, and Pt; metal oxides such
as indium tin oxide (ITO), indium zinc oxide (IZO), and zinc
oxide (ZnO); and organic conductors such as p-doped con-
jugated polymers like PEDOT. Suitable cathode materials
include transparent conductive oxides (TCO) and thin films
of metals such as gold and silver. Examples of suitable TCO
include ITO, IZO, aluminum zinc oxide (AZO), fluorinated
tin oxide (FTO), tin oxide ($SiO_2$), titanium dioxide ($TiO_2$),
ZnO, indium zinc oxide (In—Zn—O series), indium gallium
oxide, gallium zinc oxide, indium silicon zinc oxide, indium
gallium zinc oxide, or combinations thereof.

Referring again to FIGS. 1-3, the TFT array 102 may be
a two dimensional array of passive or active pixels, which
stores charge for read out by electronics, disposed on a layer
formed of amorphous silicon, poly-crystalline silicon, an
amorphous metal oxide, or organic semiconductors. In some
embodiments, the TFT array includes a silicon TFT array, an
oxide TFT array, an organic TFT, or combinations thereof.
Suitable examples of the amorphous metal oxides include
zinc oxide, zinc tin oxide, indium oxides, indium zinc oxides
(In—Zn—O series), indium gallium oxides, gallium zinc
oxides, indium silicon zinc oxides, and indium gallium zinc
oxides (IGZO). IGZO materials include $InGaO_3(ZnO)_m$
where m is <6 and $InGaZnO_4$. Suitable examples of the
organic semiconductors for the TFT array include, but are
not limited to, conjugated aromatic materials, such as
rubrene, tetracene, pentacene, perylenediimides, tetracyano-
quinodimethane and polymeric materials such as polythio-
phenes, polybenzodithiophenes, polyfluorene, polydiacety-
lene, poly(2,5-thiophenylene vinylene), poly(p-phenylene
vinylene), and derivatives thereof.

The TFT array 102 may be disposed on a substrate (not
shown). Suitable substrate materials include glass, ceramics,
plastics, metals or combinations thereof. The substrate may
be present as a rigid sheet such as a thick glass, a thick
plastic sheet, a thick plastic composite sheet, and a metal
plate; or a flexible sheet, such as, a thin glass sheet, a thin
plastic sheet, a thin plastic composite sheet, and metal foil.
Examples of suitable materials for the substrate include
glass, which may be rigid or flexible; plastics such as
polyethylene terephthalate, polybutylene phthalate, polyeth-
ylene naphthalate, polystyrene, polycarbonate, polyether
sulfone, polyallylate, polyimide, polycycloolefin, nor-
bornene resins, and fluoropolymers; metals such as stainless
steel, aluminum, silver and gold; metal oxides such as
titanium oxide and zinc oxide; and semiconductors such as
silicon. In certain embodiments, the substrate includes a
polycarbonate.

The scintillator layer 110 may include a phosphor material
that is capable of converting x-rays to visible light. The
wavelength region of light emitted by scintillator layer 110
may range from about 360 nanometers (nm) to about 830
nm. Suitable materials for the scintillator layer 110 include,
but are not limited to, cesium iodide (CsI), CsI (Tl) (cesium
iodide to which thallium has been added), terbium-activated
gadolinium oxysulfide (GOS), sodium iodide (NaI), lute-
tium oxides ($Lu_xO_y$) or combinations thereof. Such materials
are commercially available in the form of a sheet or screen.
The scintillator layer 110 can be applied by a deposition
technique such as a vapor deposition technique or lamina-
tion. Another example of scintillator layer that may be used
is a PIB (particle in binder) scintillator, where scintillating
particles may be incorporated in a binder matrix material
and flattened on a substrate. The scintillator layer 110 may
be a monolithic scintillator or pixelated scintillator array.
The visible light generated by the scintillator layer 110
irradiates the organic photodiode 120 disposed on the TFT
array 102. In some embodiments, the scintillator layer 110 is
excited by impinging x-ray radiation, and produces visible
light.

In some embodiments, the organic x-ray detector 100 may
further include one or more layers disposed on the second
electrode layer 108, for example a planarization layer and a
barrier layer. FIG. 2 illustrates an embodiment of an organic
x-ray detector 100 wherein the planarization layer 116 is
interposed between the second electrode layer 108 and the
scintillator layer 110. Non-limiting examples of materials
for the planarization layer 116 include a polyimide, an
acrylate, or a low solvent content silicone. The planarization
layer 116 may provide a smooth surface on the multilayered
structure 150 prior to the deposition of the scintillator layer
110.

A barrier layer 118 (or protective layer) may be further disposed between the second electrode layer 108 and the scintillator layer 110, in some embodiments. As shown in FIG. 3, in some embodiments, the barrier layer 118 is disposed between the planarization layer 116 and the scintillator layer 110. In some embodiment, the barrier layer 118 may include an inorganic material. In some embodiments, the barrier layer 118 may include silicon, a metal oxide, a metal nitride, or combinations thereof, where the metal is one of indium, tin, zinc, titanium, and aluminum. Non-limiting examples of metal nitrides and metal oxides include indium zinc oxide (IZO), indium tin oxide (ITO), silicon oxide, silicon nitride, silicon oxynitride, aluminum oxide, aluminum oxynitride, zinc oxide, indium oxide, tin oxide, cadmium tin oxide, cadmium oxide, magnesium oxide, or combinations thereof.

In certain embodiments, a process for fabricating an organic x-ray detector 100 (as shown in FIGS. 1-3) is described. As will be apparent to one of ordinary skill in the art, the fabrication process for the x-ray detector 100 may include several steps, and the thermal treatment step may be performed after performing one or more of the fabricating steps. Further, the sequence of disposing the layers and the thermal treatment step may depend on desired properties of the layers or performance of the organic x-ray detector.

Figure 4:
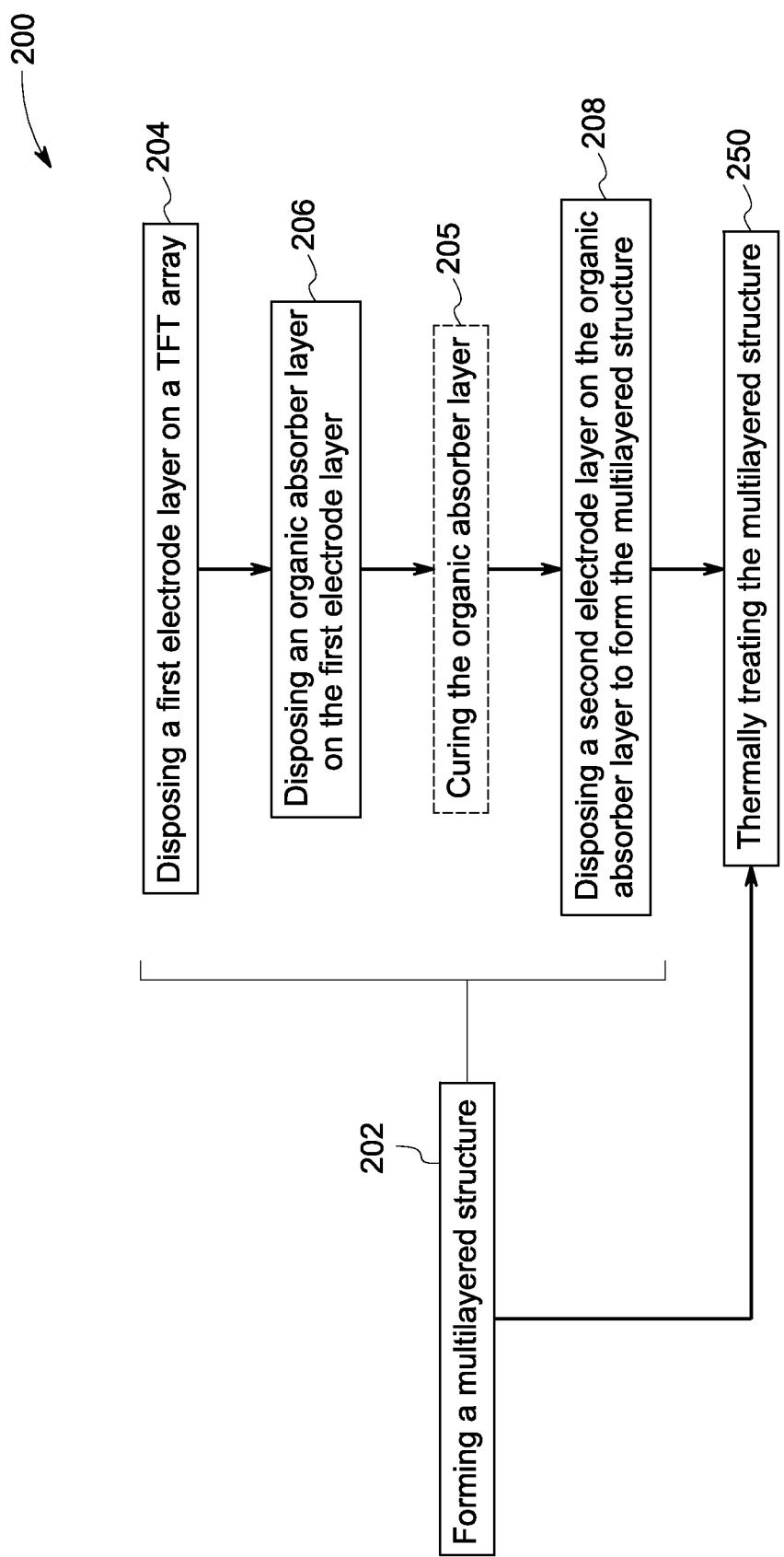
FIG. 4 is flow chart of a process for fabricating an organic x-ray detector, in accordance with one embodiment of the invention.
Figure 5:
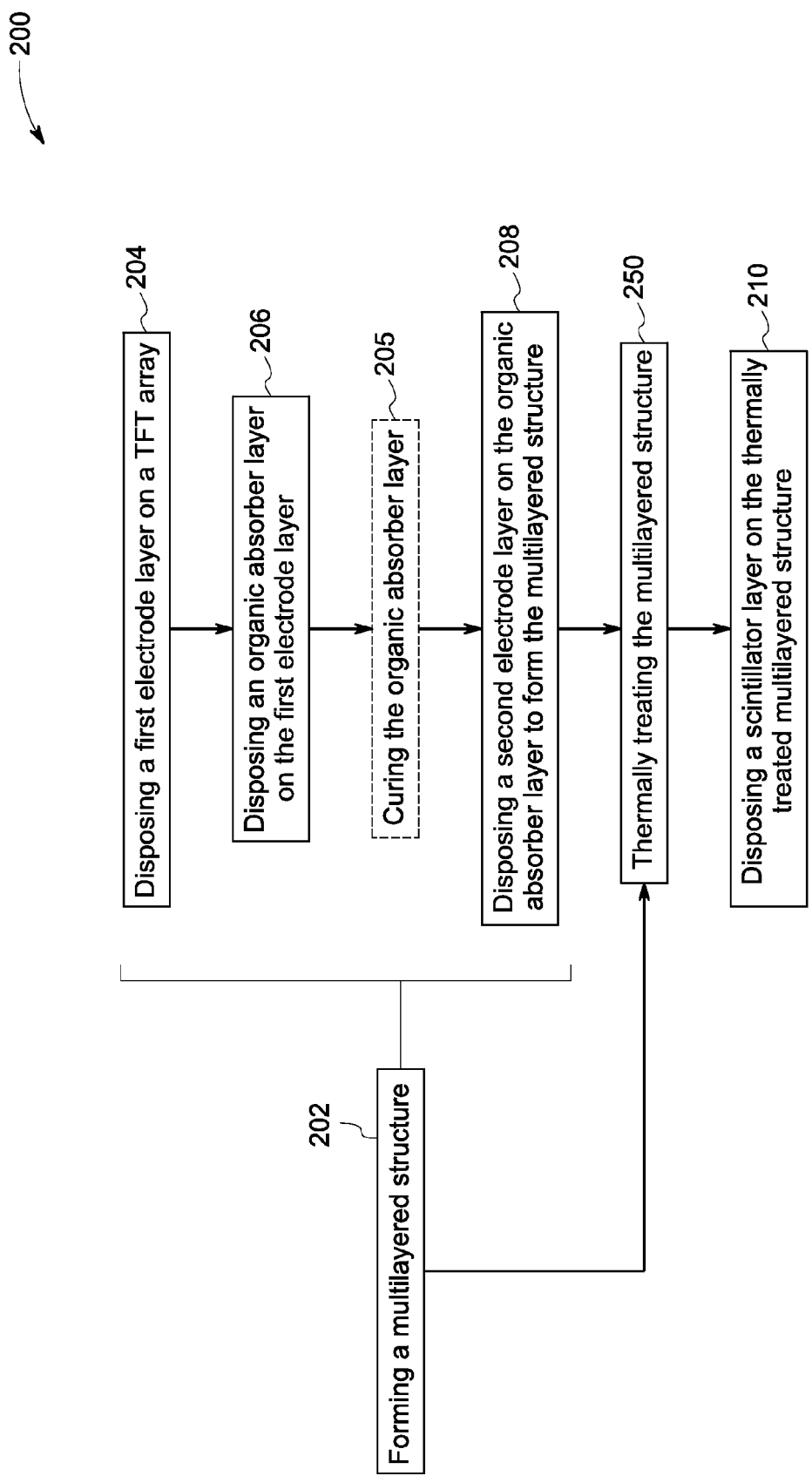
FIG. 5 is flow chart of a process for fabricating an organic x-ray detector, in accordance with one embodiment of the invention.
Figure 6:
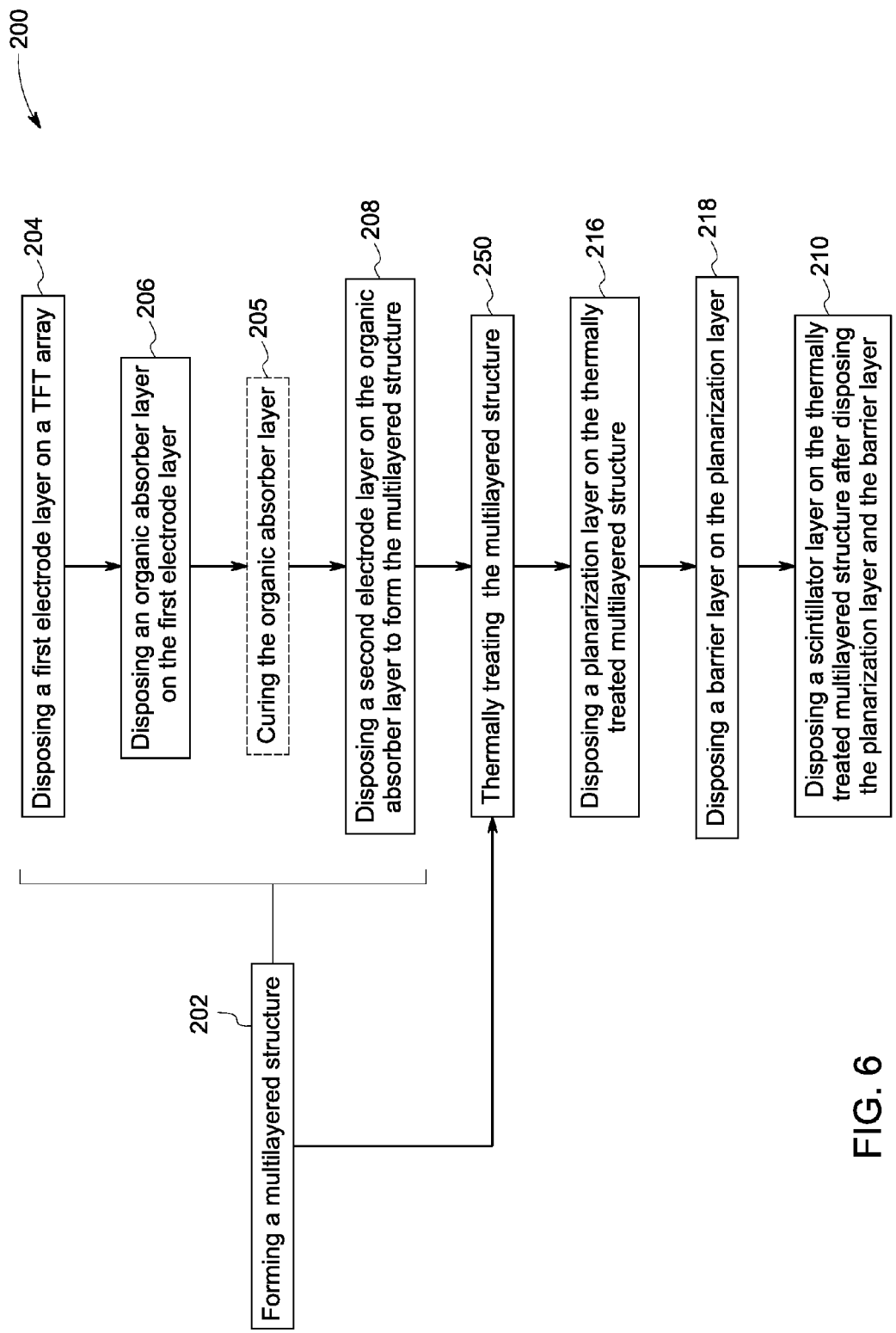
FIG. 6 is flow chart of a process for fabricating an organic x-ray detector, in accordance with one embodiment of the invention.

FIGS. 4-6 depict flow charts of a process 200 for fabricating the organic x-ray detector 100 (FIGS. 1-3) according to some embodiments. Referring to FIGS. 1-4, in some embodiments, the process 200 first includes the step 202 of forming the multilayered structure 120. In some embodiments, the step 202 of forming the multilayered structure 120 includes the step 204 of disposing a first electrode layer 104 on a TFT array 102 by any suitable technique, such as sputtering, vapor deposition, or e-beam deposition. The forming step 202 further includes the step 206 of disposing an organic absorber layer 106 on the first electrode layer 104. In some embodiments, an optional electron blocking layer (not shown) may be deposited on the first electrode layer 104 before disposing the organic absorber layer 106, by a suitable technique. In embodiments where the electron blocking layer is disposed on the first electrode layer 104, the absorber layer 106 is disposed on the electron blocking layer. In some embodiments, the organic absorber layer 106 is disposed using any suitable method, for example solution based deposition methods. Non-limiting examples of the deposition methods for the absorber layer 106 may include one or more of solvent casting, spin coating, dip coating, spray coating, slot-die coating, blade coating or any other solution based methods. Following the deposition of the organic absorber layer 106, the step 206 may further include an optional step 205 of curing the organic absorber layer 106 to remove a solvent used while disposing the organic absorber layer by a solution based method. In some embodiments, the step of curing of the organic absorber layer 106 is carried out at a temperature in a range from about 50 degrees Celsius to about 300 degrees Celsius for at least 10 minutes.

The forming step 202 may further include the step 208 of disposing a second electrode layer 108 on the absorber layer 106, and thereby forming the multilayered structure 150. The second electrode layer 108 may be disposed by a suitable deposition technique, such as thermal evaporation, sputtering and direct printing. In some embodiments, the forming step 202 may include the step of disposing a hole blocking layer (not shown in Figures). In embodiments where the hole blocking layer is disposed on the absorber layer 106 prior to the step of disposing the second electrode layer 108, the second electrode layer 108 is disposed directly on the hole blocking layer.

The process 200 further includes the step 250 of thermally treating the multilayered structure 150 after the step 208 of disposing the second electrode layer 108. The terms "thermally treating" and "thermal treatment", as used herein, refer to exposing the multilayered structure to a temperature such that the desired performance properties of the organic x-ray detector are achieved. In some embodiments, the thermal treatment step includes heating the multilayered structure. In some embodiments, the thermal treatment step includes exposing the multilayered structure to a temperature greater than about 70 degrees Celsius. In some embodiments, the thermal treatment step includes exposing the multilayered structure to a temperature in a range from about 80 degrees Celsius to about 150 degrees Celsius. In certain embodiments, the thermal treatment step includes exposing the multilayered structure to a temperature in a range from about 90 degrees Celsius to about 120 degrees Celsius. The multilayered structure may be heated to the desired temperature in a furnace or oven, or alternatively through the use of a heat lamp, laser, or other sources of heat.

The multilayered structure may be exposed to a desired temperature for a desired time. Time and temperature are interrelated, and may be adjusted together, for example, increasing time while reducing temperature, or increasing temperature while reducing time. In some embodiments, the thermal treatment step is performed for a time duration less than 100 hours. In some embodiments, the thermal treatment step is performed for a time duration less than 50 hours. In some embodiments, the thermal treatment step is performed for a time duration less than 20 hours. In some embodiments, the thermal treatment step is performed for a time duration in a range from about 15 minutes to about 1 hour. In some embodiments, the thermal treatment step is performed for a time duration in a range from about 1 hour to about 20 hours.

In some embodiments, the process 200 may further include the step 210 of disposing a scintillator layer 110 on the second electrode layer 108, as shown in FIG. 5. The scintillator layer 110 may be disposed by depositing a suitable scintillator material on the second electrode layer 108 or by providing a suitable scintillator sheet. The thermal treatment step 250 may be performed before or after the step 210 of disposing the scintillator layer 110.

In some embodiments, as illustrated in the flow chart of FIG. 5, the thermal treatment step 250 is performed before the step of disposing the scintillator layer 110. In these embodiments, the process 200 includes the step 210 of disposing the scintillator layer 110 on the thermally treated multilayered structure. In some embodiments, the process 200 may further include the step 216 of disposing a planarization layer 116 on the multilayered structure 150. In these embodiments, the thermal treatment step 250 may be performed before or after the step 216 of disposing the planarization layer 116. In some embodiments, the process 200 may further include the step 218 of disposing a barrier layer 118 on the multilayered structure 150. In some embodiments, the step 218 of disposing the barrier layer 118 is performed after disposing the planarization layer 116, and the barrier layer 118 is disposed on the planarization layer 116. In these embodiments, the thermal treatment step 250 may be performed before or after the step 218 of disposing the barrier layer 118.

Figure 7:
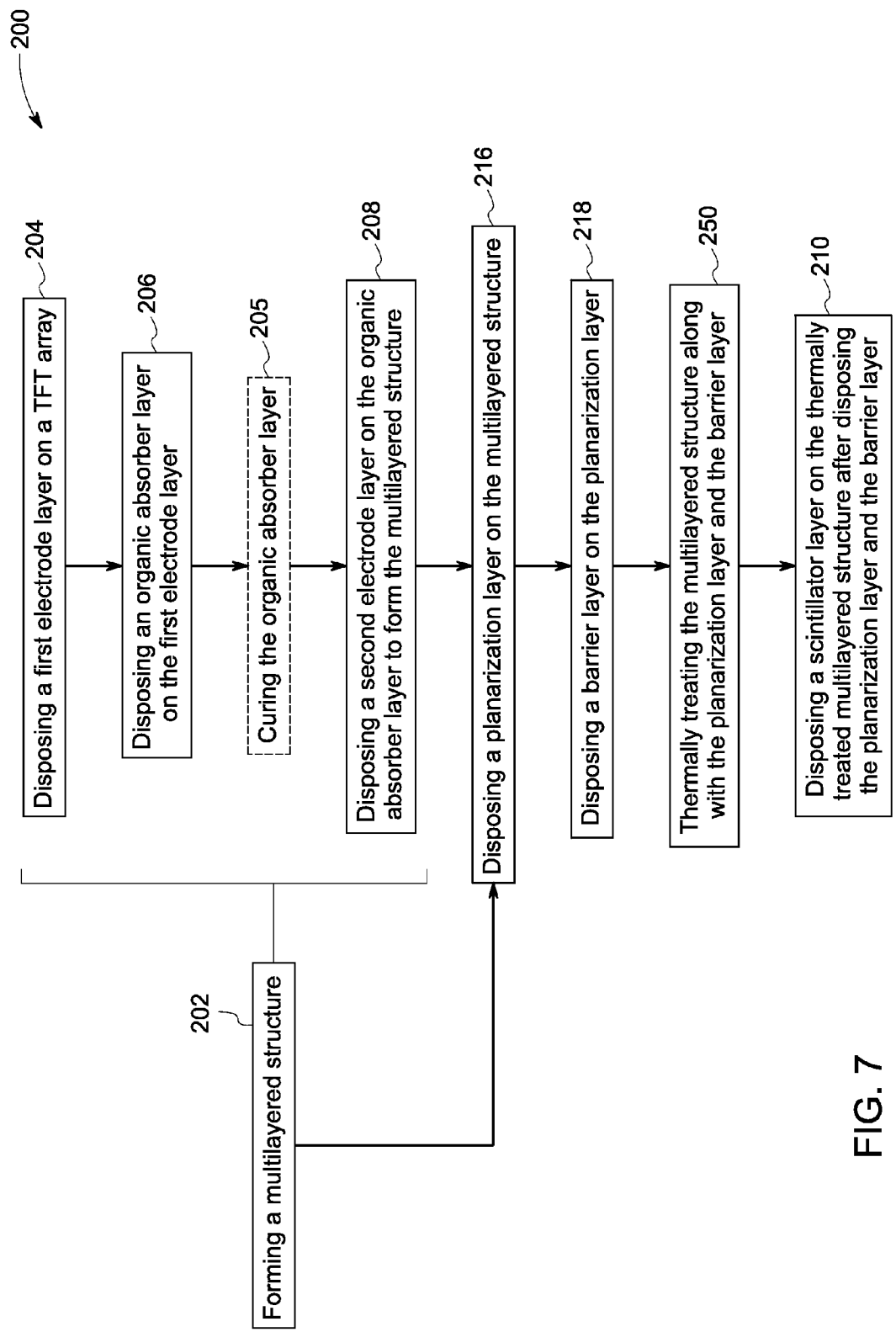
FIG. 7 is flow chart of a process for fabricating an organic x-ray detector, in accordance with one embodiment of the invention.

In embodiments where at least one of the planarization layer 116 or the barrier layer 118 is disposed on the second electrode layer 108 before the step of disposing the scintillator layer 110, the thermal treatment step 250 may be performed before or after one or more steps of disposing the planarization layer 116 or the barrier layer 118. FIG. 6 is a flow chart of the process 200 where the thermal treatment step 250 is performed before the step 216 of disposing the planarization layer 116 on the multilayered structure 150. In some other embodiments, the thermal treatment step 250 may be performed after the steps of disposing the planarization layer 116 and the barrier layer 118 and before the step 210 of disposing the scintillator layer 110, as illustrated in FIG. 7.

Figure 8:
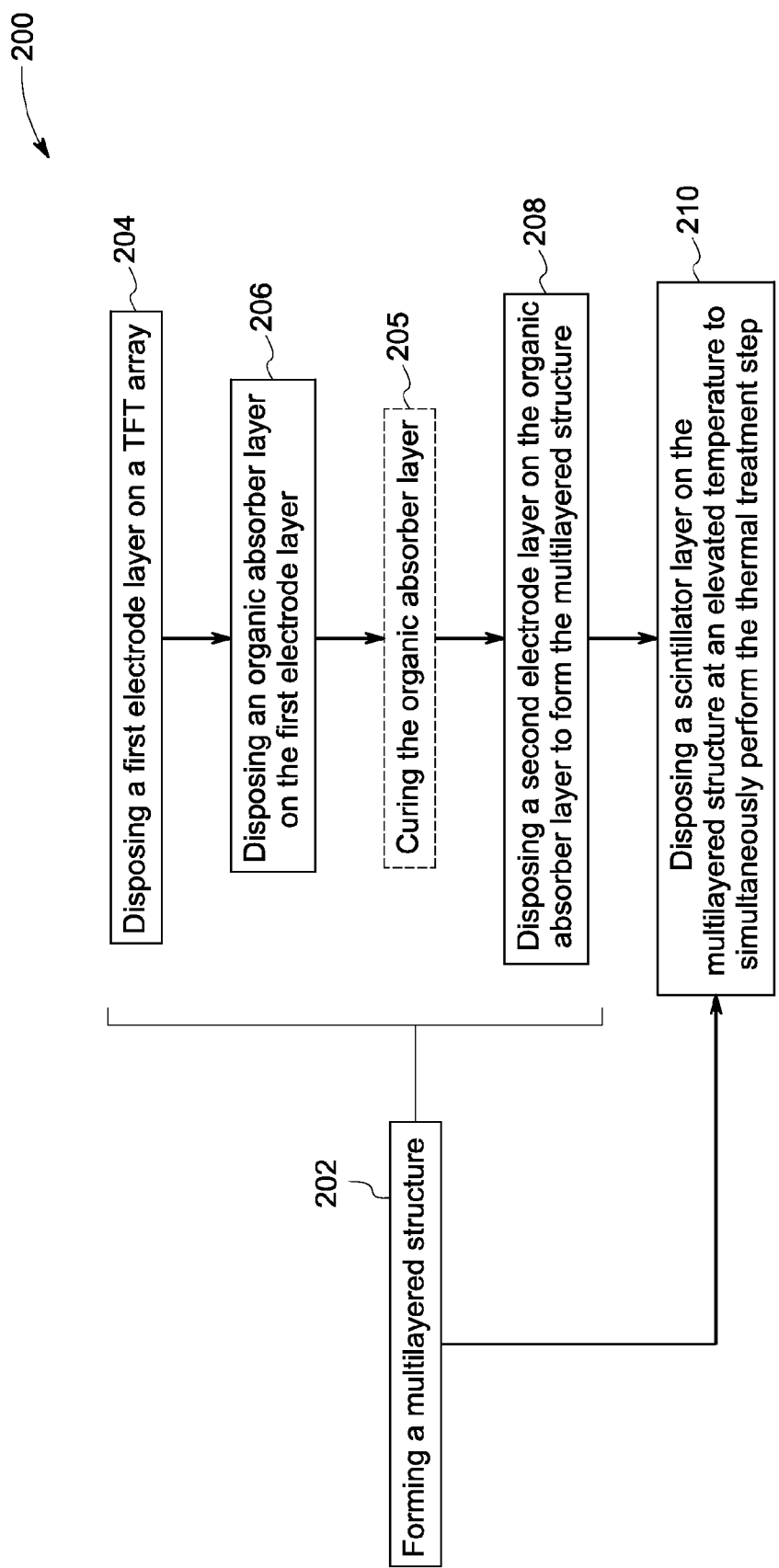
FIG. 8 is flow chart of a process for fabricating an organic x-ray detector, in accordance with one embodiment of the invention.

In some embodiments, the thermal treatment step 250 may be performed simultaneously with the step 210 of disposing the scintillator layer 110. For example, FIG. 8 shows a flow chart of such a process 200. In these embodiments, the step 210 of disposing the scintillator layer 110 may be performed at an elevated temperature suitable for thermally treating the multilayered structure 150. In some such embodiments, the process 200 may further include one or more steps (216, 218) of disposing the planarization layer 116 and the barrier layer 118 before the step 210 of disposing the scintillator layer 110.

Figure 9:
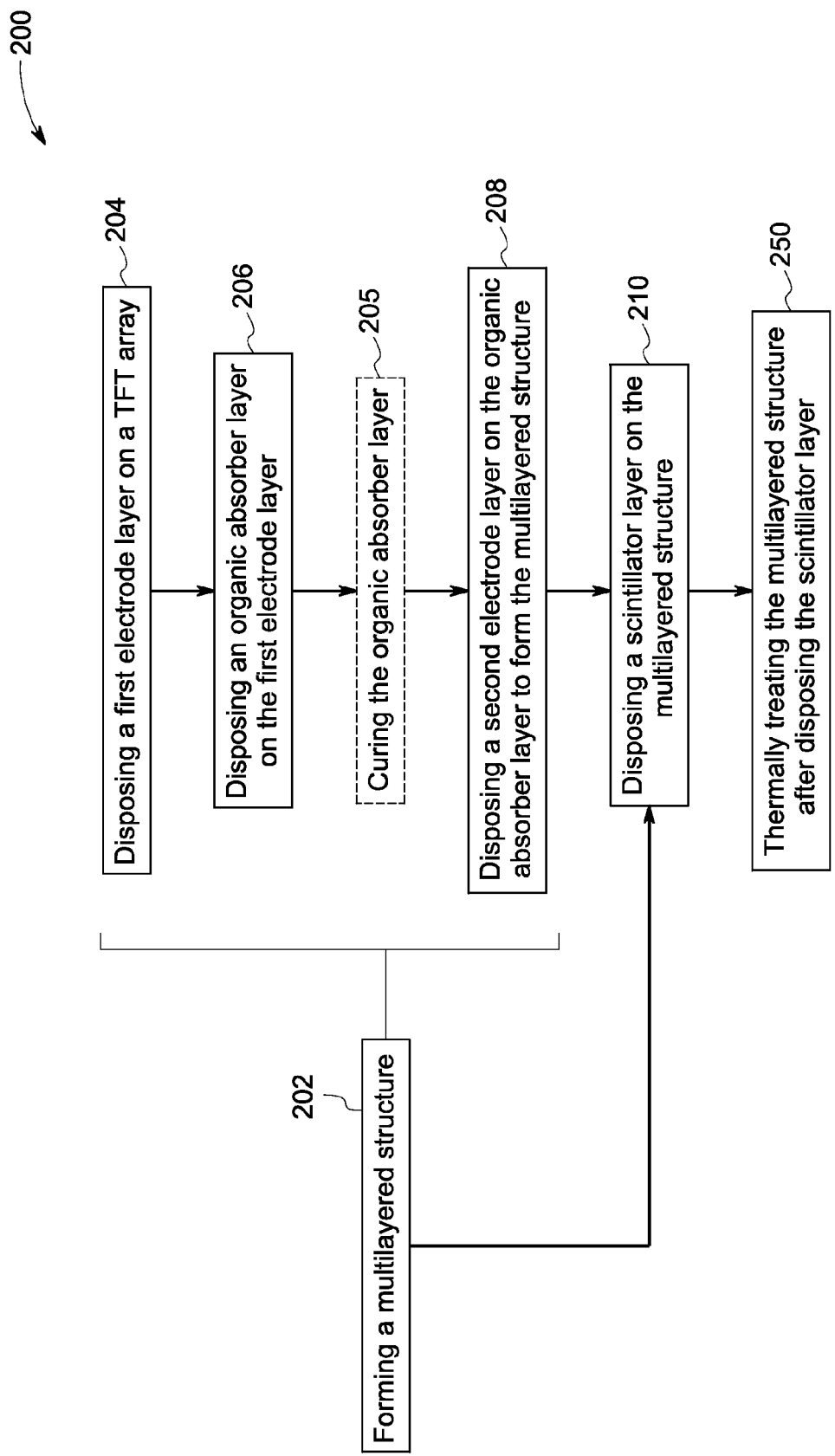
FIG. 9 is flow chart of a process for fabricating an organic x-ray detector, in accordance with one embodiment of the invention.
Figure 10:
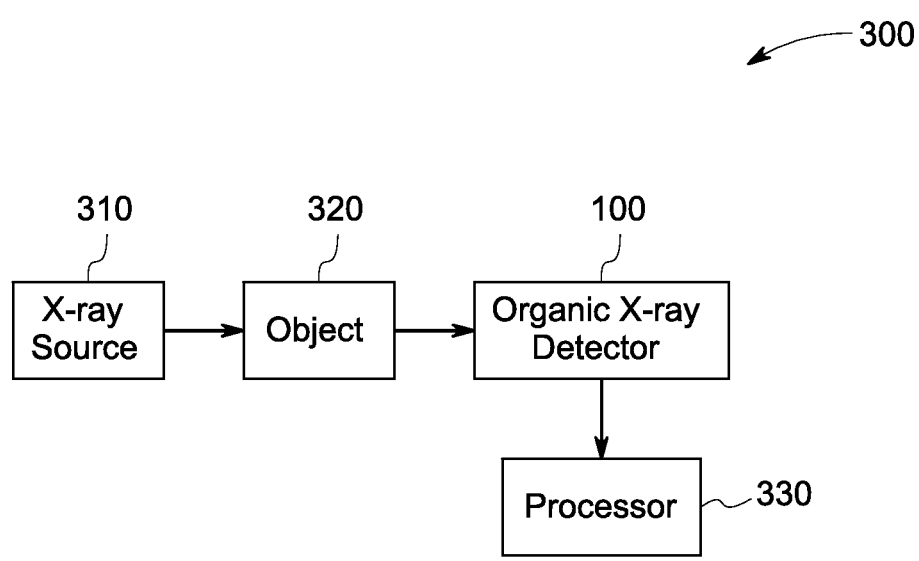
FIG. 10 is schematic of an x-ray system, in accordance with one embodiment of the invention.

In some other embodiments, the thermal treatment step 250 is performed after the step 210 of disposing the scintillator layer 110, as illustrated in the flow chart of FIG. 9. In some such embodiments, the process 200 may further include one or more steps (216, 218) of disposing the planarization layer 116 and the barrier layer 118 before the step 210 of disposing the scintillator layer 110.

As described previously, the absorber layer may be cured before disposing the second electrode layer. Curing of the absorber layer may be required to remove the solvent used while depositing the absorber layer. Because of difference in the surface energies of the donor material and the acceptor material, the curing step may cause vertical phase separation (that is, across the thickness of the absorber layer) of the donor and acceptor material resulting in non-homogeneous phase separation and non-uniform distribution of donor and acceptor materials.

Without being bound by any theory, it is believed that by thermally treating the multilayered structure after disposing the second electrode layer (that may have a surface energy much higher than air and is matching with the donor and acceptor materials), may advantageously improve the morphology of the organic absorber layer. In some embodiments, the organic absorber layer may attain substantially uniform morphology after performing the thermal treatment step. In some embodiments, after performing the thermal treatment step, the organic absorber layer may have a homogeneous phase separation and continuous distribution of the donor and acceptor phases. As described previously, the improved morphology of the absorber layer aids in enhancing one or more of charge generation, transport and extraction.

In certain embodiments, the organic x-ray detector 100 fabricated by the process in accordance with some embodiments, has a lag value equal to or less than about 4 percent. In some embodiments, the lag value of the organic x-ray detector is less than about 3 percent. In some embodiments, the lag value of the organic x-ray detector 100 is in a range from about 0.01 percent to about 2 percent.

As used herein, the term "lag value" refers to a lag value of the organic x-ray detector measured in a given timing mode. As used herein, the term "timing mode" refers to a lag measurement mode under given testing conditions. In general, during the lag measurements, a radiation field is first delivered and image signal is measured at frame 0, and the signals in subsequent dark frames (no x-rays) are measured. These subsequent frames (frames 1, 2, and so on) contain signals due to delayed temporal response, referred to as "lag". The amount of lag in the $n^{th}$ frame ($L_n$) can be calculated based on the formula $$L_n = \left(\frac{I_n - B}{I_o - B}\right) \times 100$$

where $I_n$ and $I_o$ are the mean detector signals, respectively at the $n^{th}$ frame and the $0^{th}$ frame, and B is the dark current determined from the offset images. In some embodiments, the lag value, as used herein, relates to the first frame lag.

In some embodiments, an x-ray system is also presented. As shown in FIG. 8, the x-ray system 300 includes an x-ray source 310 configured to irradiate an object 320 with x-ray radiation; an organic x-ray detector 100 as described earlier, and a processor 330 operable to process data from the organic x-ray detector 100.

An x-ray detector according to embodiments of the present disclosure may be used in imaging systems, for example, in conformal imaging, with the detector in intimate contact with the imaging surface. For parts with internal structure, the detector may be rolled or shaped to contact the part being imaged. Applications for the organic x-ray detectors according to embodiments of the present disclosure include security imaging; medical imaging; and industrial and military imaging for pipeline, fuselage, airframe and other tight access areas.

EXAMPLES

Example 1: Organic X-Ray Detectors (OXRD) Fabricated with and without the Thermal Treatment Step Two sets of OXRDs were fabricated. A first set of OXRDs (Comparative OXRD set) includes a number of comparative OXRDs that were fabricated without the thermal treatment step after the step of disposing the cathode. A second set of OXRDs (Experimental OXRD set) includes same number of Experimental OXRDs as used in the first set, which were fabricated with the thermal treatment step after the step of disposing the cathode. Both the OXRD sets were fabricated using same materials for depositing the multilayered structures for the OXRDs. Absorber blends were prepared in the nitrogen glove box by dissolving a donor polymer in a fullerene based acceptor at a 1:1 weight ratio at 20-80 mg/mL into chlorobenzene.

A thin film transistor (TFT) substrate having a TFT array pre-coated with indium titanium oxide (ITO) was used as the substrate. An 80 nm layer of an electron blocking layer composed of a crosslinkable polymer was deposited onto the ITO substrate via spin-coating and then UV cured and baked for 1 hour at 180° C. in a $N_2$ purged glove box. An absorber layer composed of the absorber blend was then spin-coated atop the electron blocking layer inside of a $N_2$ purged glove box followed by baking for 1 hour at about 75 degrees Celsius. An ITO cathode layer was deposited by sputtering on the absorber layer. Following the deposition of the ITO cathode layer, the resulting multilayered structure of the Experimental OXRD set was heated in an oven at about 80 degrees Celsius for about 12 hours. Fabrication of an Experimental OXRD was completed with a scintillator layer deposition. A DRZ-Plus scintillator (Mitsubishi Chemical) composed of gadolinium sulfoxylate doped with terbium (Gd2O2S:Tb) was laminated to the ITO cathode layer of the multilayered structure using a pressure sensitive adhesive (PSA) film from 3M under the product name of 8191L. Similarly, a number of Experimental OXRDs were fabricated.

The Comparative OXRDs were fabricated in a similar fashion as described for Experimental OXRDs except for the heating step of the multilayered structure after the deposition of the ITO cathode layer.

Example 2: Organic X-Ray Detector (OXRD) Imagers

Two sets of OXRDs imagers (Comparative OXRD imager set and Experimental OXRD imager set) were formed using the Comparative OXRDs and the Experimental OXRDs as fabricated in Example 1.

Performance of the two sets of OXRD imagers were characterized using an imager functional tester under same timing mode. The resulting data of the Comparative OXRD imager set was collated as Comparative Data Set. The resulting data of the Experimental OXRD imager set was collated as Experimental Data set. A Two-sample T test was conducted on the two Data sets—Comparative Data set and Experimental Data set.

Table 1 shows the first frame lag-mean values (mean lag values) for the Comparative Data set and Experimental Data set.

TABLE 1

Performance of organic X-ray detector imagers

| Sample | First frame lag - mean value | Standard deviation | P-value for AD Normality test |
|---|---|---|---|
| Comparative Data set | 4.55 | 0.92 | 0.039 |
| Experimental Data set | 3.34 | 0.58 | 0.628 |

As shown in Table 1, the imagers of the Experimental OXRD imager set, exhibit significantly reduced mean lag value, and thus increased quantum efficiency; and significantly reduced standard deviation from a normal distribution with a P-value based on Anderson-Darling (AD) normality test. Further, the run chart of Experimental Data set was relatively more random than that of the Comparative Data set. Thus, the Experimental Data set for Experimental OXRD imagers (that were fabricated with the thermal treatment step) with reduced standard deviation and higher P-value (normal distribution), indicates improved performance, process control and capability when compared to Comparative Data set for Comparative OXRD imagers (that were fabricated without the thermal treatment step).

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A process for fabricating an organic x-ray detector, the process comprising:
    forming a multilayered structure, comprising:
        disposing a first electrode layer on a thin film transistor array;
        disposing an organic absorber layer on the first electrode layer;
        disposing a second electrode layer on the organic absorber layer;
        disposing a scintillator layer on the second electrode layer; and
    thermally treating the multilayered structure after the step of disposing the second electrode layer.

2. The process according to claim 1, wherein the step of thermally treating the multilayered structure comprises exposing the multilayered structure to a temperature in a range from about 80 degrees Celsius to about 150 degrees Celsius.

3. The process according to claim 1, wherein the step of thermally treating the multilayered structure comprises exposing the multilayered structure to a temperature in a range from about 100 degrees Celsius to about 120 degrees Celsius.

4. The process according to claim 1, wherein the thermal treatment step is performed before or after the step of disposing the scintillator layer.

5. The process according to claim 1, wherein the thermal treatment step is performed during the step of disposing the scintillator layer.

6. The process according to claim 1, further comprising disposing a planarization layer on the multilayered structure before the step of disposing the scintillator layer, wherein the thermal treatment step is performed before or after the step of disposing the planarization layer.

7. The process according to claim 1, further comprising disposing a barrier layer on the multilayered structure before the step of disposing the scintillator layer, wherein the thermal treatment step is performed before or after the step of disposing the barrier layer.

8. The process according to claim 1, wherein the scintillator layer comprises cesium iodide (CsI), terbium-activated gadolinium oxysulfide (GOS), sodium iodide (NaI), lutetium oxides ($Lu_xO_y$), or combinations thereof.

9. The process according to claim 1, wherein the step of disposing scintillator layer is performed by a vapor deposition technique.

10. An organic x-ray detector fabricated by the process in accordance with claim 1.

11. An x-ray system comprising the organic x-ray detector in accordance with claim 10.

12. A process for fabricating an organic x-ray detector, the process comprising:
    forming a multilayered structure, comprising:
        disposing a first electrode layer on a thin film transistor array;
        disposing an organic absorber layer on the first electrode layer; and
        disposing a second electrode layer on the organic absorber layer;
    thermally treating the multilayered structure after the step of disposing the second electrode layer; and
    disposing a scintillator layer on the thermally treated multilayered structure.

13. The process according to claim 12, wherein the step of thermally treating the multilayered structure comprises exposing the multilayered structure to a temperature in a range from about 80 degrees Celsius to about 150 degrees Celsius.

14. The process according to claim 12, wherein the step of thermally treating the multilayered structure comprises exposing the multilayered structure to a temperature in a range from about 100 degrees Celsius to about 120 degrees Celsius.

15. An organic x-ray detector fabricated by the process in accordance with claim 12, wherein the organic x-ray detector has a lag value equal to or less than about 4 percent.

16. An x-ray system comprising the organic x-ray detector in accordance with claim 15.

* * * * *